US012642133B2

(12) United States Patent
Liu et al.

(10) Patent No.: US 12,642,133 B2
(45) Date of Patent: May 26, 2026

(54) HIGH-VOLTAGE FLIP-CHIP SEMICONDUCTOR LIGHT-EMITTING DEVICE

(71) Applicant: XIAMEN SANAN OPTOELECTRONICS CO., LTD., Fujian (CN)

(72) Inventors: Shiwei Liu, Fujian (CN); Gaolin Zheng, Fujian (CN); Anhe He, Fujian (CN); Qing Wang, Fujian (CN); Ling-yuan Hong, Fujian (CN); Kang-Wei Peng, Fujian (CN); Su-hui Lin, Fujian (CN)

(73) Assignee: XIAMEN SANAN OPTOELECTRONICS CO., LTD., Fujian (CN)

( * ) Notice: Subject to any disclaimer, the term of this patent is extended or adjusted under 35 U.S.C. 154(b) by 715 days.

(21) Appl. No.: 17/857,741

(22) Filed: Jul. 5, 2022

(65) Prior Publication Data

US 2022/0344311 A1 Oct. 27, 2022

Related U.S. Application Data

(63) Continuation-in-part of application No. PCT/CN2020/072489, filed on Jan. 16, 2020.

(51) Int. Cl.
*H10W 90/00* (2026.01)
*H10H 20/814* (2025.01)
(Continued)

(52) U.S. Cl.
CPC .......... *H10W 90/00* (2026.01); *H10H 20/814* (2025.01); *H10H 20/8162* (2025.01); *H10H 20/8312* (2025.01); *H10H 20/857* (2025.01)

(58) Field of Classification Search
CPC . H01L 25/0753; H01L 25/167; H10H 20/814; H10H 20/857
See application file for complete search history.

(56) References Cited

U.S. PATENT DOCUMENTS 7,531,959 B2 * 5/2009 Hatwar ................. H10K 50/125
313/506
2014/0353692 A1 * 12/2014 Oh ........................ H10H 20/833
257/88

(Continued)

FOREIGN PATENT DOCUMENTS

CN 106159056 A * 11/2016 ......... H01L 33/0075
CN 108847437 A * 11/2018 ......... H01L 33/0075

OTHER PUBLICATIONS

Search Report issued to PCT application No. PCT/CN2020/072489 on Sep. 9, 2020.

*Primary Examiner* — Michele Fan
(74) *Attorney, Agent, or Firm* — MUNCY, GEISSLER, OLDS & LOWE, P.C.

(57) ABSTRACT

A high-voltage flip-chip semiconductor light-emitting device includes a substrate, at least two semiconductor light-emitting units, an isolation trench, a conducting layer, an isolating layer, a connecting layer, and a Bragg reflection layer. The semiconductor light-emitting units and the conducting layer are sequentially disposed on the substrate. The isolation trench is formed between the semiconductor light-emitting units. The isolating layer partially covers the conducting layer. The connecting layer is disposed on the isolating layer and electrically connects the semiconductor light-emitting units. The Bragg reflection layer covers the connecting layer and the isolating layer.

20 Claims, 10 Drawing Sheets

(51) Int. Cl.
   H10H 20/816        (2025.01)
   H10H 20/831        (2025.01)
   H10H 20/857        (2025.01)

(56)                References Cited

U.S. PATENT DOCUMENTS

2019/0304386 A1* 10/2019 Kim ......................... G09G 3/32
2020/0388728 A1* 12/2020 Chuang ................ H10H 20/862
2021/0359188 A1* 11/2021 Kim ..................... H10H 29/142

* cited by examiner

Percentage of number of tested samples of Example

Forward voltage (VF4)

Percentage of number of tested samples of Comparative Example

Forward voltage (VF4)

HIGH-VOLTAGE FLIP-CHIP SEMICONDUCTOR LIGHT-EMITTING DEVICE

CROSS-REFERENCE TO RELATED APPLICATION

This application is a bypass continuation-in-part application of PCT International Application No. PCT/CN2020/072489 filed on Jan. 16, 2020. The entire content of the international patent application is incorporated herein by reference.

FIELD

The disclosure relates to a high voltage flip-chip semiconductor light-emitting device, and more particularly to a high voltage flip-chip semiconductor light-emitting device that can be applied in the fields of a backlight display and a RGB display.

BACKGROUND

A high-voltage flip-chip light-emitting diode has been continuously applied in a large power field (e.g., lighting, backlight or RGB display) due to its excellent heat dissipating performance. In recent years, with the development of the RGB display and backlight local dimming techniques, a luminous efficiency and a brightness uniformity of the high-voltage flip-chip light-emitting diode have attracted more attention.

Referring to FIGS. 1 and 2, a conventional high-voltage flip-chip light-emitting diode includes a substrate 900, at least two semiconductor light-emitting units, an isolation trench 905', a transparent conducting layer 906, a transparent isolating layer 905, a connecting layer 907, a first electrode 908, a second electrode 909, a Bragg reflection layer 910, a first electrode pad 911, and a second electrode pad 912. A process for manufacturing the conventional high-voltage flip-chip light-emitting diode includes: (i) forming a semiconductor light-emitting structure on the substrate 900, and then etching the semiconductor light-emitting structure to form the at least two semiconductor light-emitting units and an isolation trench 905' that is located between and separates the at least two semiconductor light-emitting units and that is defined by an upper surface of the substrate 900 and a side surface of each of the at least two semiconductor light-emitting units, each of the at least two semiconductor light-emitting units including a first conductivity type semiconductor layer 902, a light-emitting layer 903, and a second conductivity type semiconductor layer 904 that are sequentially disposed on the upper surface of the substrate 900, the upper surface of the substrate 900 being a patterned surface 901; (ii) forming the transparent isolating layer 905 that covers the upper surface of the substrate 900, and a part of a top surface and the side surface of each of the at least two semiconductor light-emitting units; (iii) forming the transparent conducting layer 906 (e.g., made of indium tin oxide (ITO)) on the top surface of each of the at least two semiconductor light-emitting units and the transparent isolating layer 905, and then annealing the transparent conducting layer 906, so that the transparent conducting layer 906 forms an ohmic contact with the second conductivity type semiconductor layer 904; (iv) forming the connecting layer 907, the first electrode 908, the second electrode 909, and the Bragg reflection layer 910 by evaporation, the connecting layer 907 electrically connecting each of the at least two semiconductor light-emitting units, the Bragg reflection layer 910 covering each of the at least two semiconductor light-emitting units and having two openings; and (v) forming the first electrode pad 911 and the second electrode pad 912 that are used for external electrical connection, the first electrode pad 911 passing through one of the openings to contact the first electrode 908 and the second electrode pad 912 passing through the other one of the openings to contact the second electrode 909. A portion of the transparent isolating layer 905 serving as an insulating isolation area is disposed between the connecting layer 907 and the side surface of each of the at least two semiconductor light-emitting units. The remaining portion of the transparent isolating layer 905 serving as a current blocking area is disposed between the transparent conducting layer 906 and the second conductivity type semiconductor layer 904 to avoid a current flow in a direction from the connecting layer 907 to the second conductivity type semiconductor layer 904 and facilitating spreading the current in the transparent conducting layer 906. Such process for manufacturing the conventional high-voltage flip-chip light-emitting diode is simple and cost controllable. In addition, the conventional high-voltage flip-chip light-emitting diode manufactured by such process can have the uniform and high brightness when operated under a normal working current.

However, when tested under a small current, the brightness of the conventional high-voltage flip-chip light-emitting diode is not uniform, which cannot meet the requirements of light uniformity for a RGB display device or a backlight device having a local dimming function. In addition, it is found that, compared with a flip-chip light-emitting diode, a forward voltage (i.e., VF4) of each of the at least two semiconductor light-emitting units of the high-voltage flip-chip light-emitting diode operated under the small current is obviously lower, and the brightness thereof is not uniform.

SUMMARY

An object of the disclosure is to provide a high-voltage flip-chip semiconductor light-emitting device and a display device which can alleviate or overcome the aforesaid shortcomings of the prior art.

According to a first aspect of the disclosure, a high-voltage flip-chip semiconductor light-emitting device includes a substrate, at least two semiconductor light-emitting units, an isolation trench, a conducting layer, an isolating layer, a connecting layer, and a Bragg reflection layer.

The substrate has a first surface and a second surface which are spaced apart from each other.

Each of the at least two semiconductor light-emitting units includes a first conductivity type semiconductor layer, a light-emitting layer, and a second conductivity type semiconductor layer which are sequentially disposed on the first surface of the substrate.

The isolation trench is formed between and separates the at least two semiconductor light-emitting units, and is defined by the first surface of the substrate and a side surface of each of the at least two semiconductor light-emitting units.

The conducting layer is disposed on the second conductivity type semiconductor layer opposite to the light-emitting layer.

The isolating layer covers the side surface of each of the at least two semiconductor light-emitting units, a side surface of the conducting layer, and a portion of an upper surface of the conducting layer. The upper surface of the conducting layer is partially exposed from the isolating layer.

The connecting layer is disposed on the isolating layer, contacts the exposed upper surface of the conducting layer, and electrically connects the at least two semiconductor light-emitting units.

The Bragg reflection layer covers the connecting layer and the isolating layer.

According to a second aspect of the disclosure, a display device includes a backlight module that includes the aforesaid high-voltage flip-chip semiconductor light-emitting device.

According to a third aspect of the disclosure, an RGB display device includes the aforesaid high-voltage flip-chip semiconductor light-emitting device.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
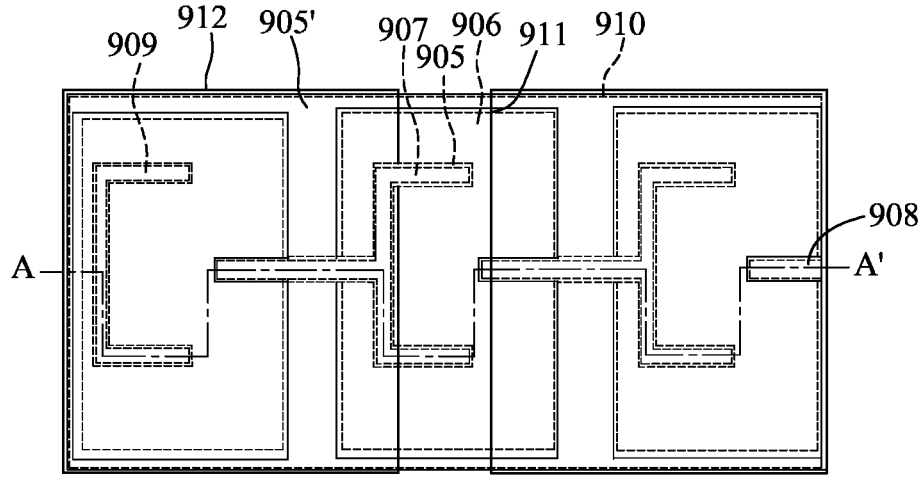
FIG. 1 is a schematic top view illustrating a conventional high-voltage flip-chip light-emitting diode.

Before the disclosure is described in greater detail, it should be noted that where considered appropriate, reference numerals have been repeated among the figures to indicate corresponding or analogous elements, which may optionally have similar characteristics.

It should be noted that, the drawings are schematic views illustrating basic idea of the disclosure. The number, the shape and the size of the components in the disclosure may be arbitrarily changed in actual practice.

Figure 3:
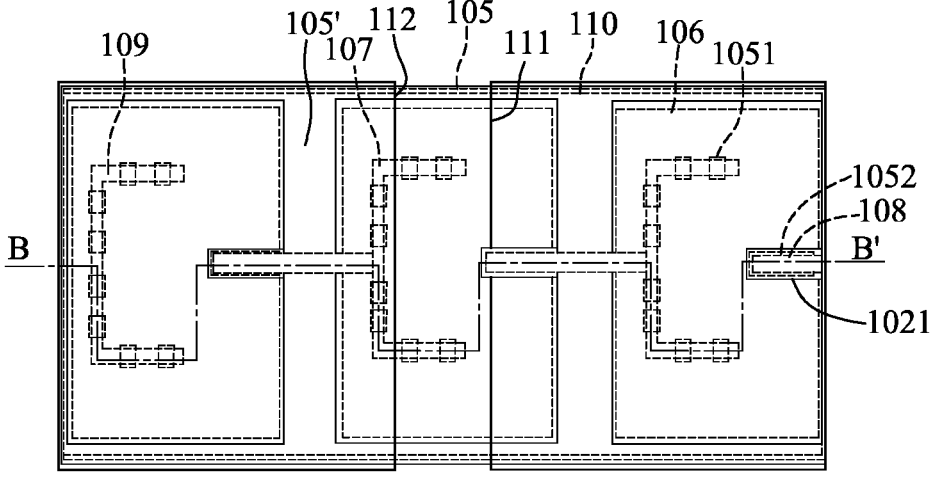
FIG. 3 is a schematic top view illustrating a first embodiment of a high-voltage flip-chip semiconductor light-emitting device according to the disclosure.
Figure 4:
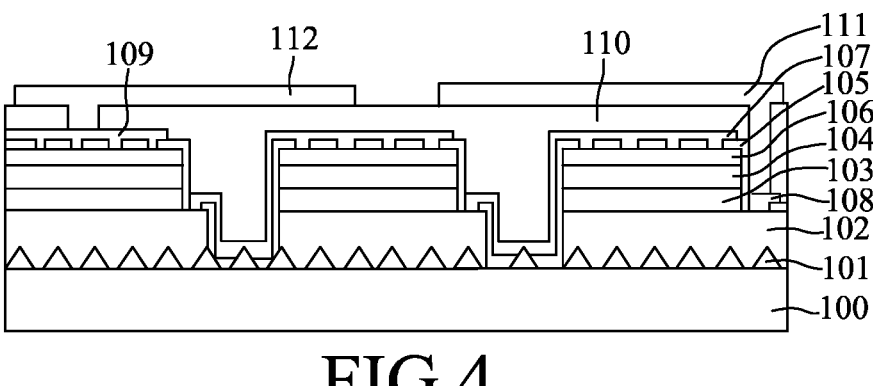
FIG. 4 is a cross-sectional view taken along line B-B' of FIG. 3.

Referring to FIGS. 3 and 4, a first embodiment of a high-voltage flip-chip semiconductor light-emitting device according to the present disclosure includes a substrate 100, at least two semiconductor light-emitting units, an isolation trench 105', a conducting layer 106, an isolating layer 105, a connecting layer 107, a first electrode 108, a second electrode 109, a Bragg reflection layer 110, a first electrode pad 111, and a second electrode pad 112. FIGS. 5 to 13 illustrate schematic views of the intermediate stages of a method for manufacturing the first embodiment.

Figure 5:
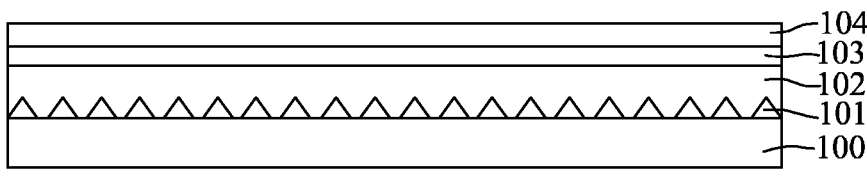
FIGS. 5 to 13 illustrate schematic views of intermediate stages of a method for manufacturing the first embodiment.

Referring to FIG. 5, the substrate 100 and a semiconductor light-emitting structure are provided. The substrate 100 may be made of a light-transmissive material, such as sapphire, gallium arsenide, glass, or other light-transmissive materials. The substrate 100 has a first surface and a second surface which are spaced apart from each other, and the second surface is a light-emitting surface. The first surface of the substrate 100 may be a patterned surface formed with a patterned structure 101. The semiconductor light-emitting structure includes a first conductivity type semiconductor layer 102, a light-emitting layer 103, and a second conductivity type semiconductor layer 104 which are sequentially disposed on the first surface of the substrate 100. One of the first conductivity type semiconductor layer 102 and the second conductivity type semiconductor layer 104 is an N-type semiconductor layer, and the other one of the first conductivity type semiconductor layer 102 and the second conductivity type semiconductor layer 104 is a P-type semiconductor layer. The semiconductor light-emitting structure may be formed on the first surface of the substrate 100 by metal-organic chemical vapor deposition (MOCVD). Alternatively, the semiconductor light-emitting structure may transfer to the first surface of the substrate 100 using a transferring technique.

Figure 6:
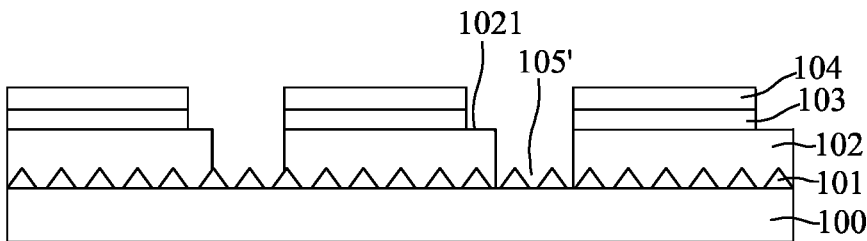

Referring to FIG. 6, the semiconductor light-emitting structure is etched to form the at least two semiconductor light-emitting units and the isolation trenches 105'. Each of the at least two semiconductor light-emitting units includes the first conductivity type semiconductor layer 102, the light-emitting layer 103, and the second conductivity type semiconductor layer 104 which are sequentially disposed on the first surface of the substrate 100. In each of the at least two semiconductor light-emitting units, a portion of the first conductivity type semiconductor layer 102 is exposed from the light-emitting layer 103 and the second conductivity type semiconductor layer 104, so as to form a mesa structure. The exposed portion of the first conductivity type semiconductor layer 102 forms a first platform 1021 used for contacting and electrically connecting to the connecting layer 107 which will be described hereinafter. In certain embodiments, the first conductivity type semiconductor layer 102 may further include a second platform (not shown) that has a height greater than that of the first platform 1021, and the light-emitting layer 103 and the second conductivity type semiconductor layer 104 are located on the second platform.

The isolation trench 105' is formed between and separates the at least two semiconductor light-emitting units, and is defined by the first surface of the substrate 100 and a side surface of each of the at least two semiconductor light-emitting units. The side surface of each of the at least two semiconductor light-emitting unit may be a slanted surface. Alternatively, a portion of the side surface of each of the at least two semiconductor light-emitting units may be a slanted surface. It is noted that the high-voltage flip-chip semiconductor light-emitting device may further include a buffer layer (not shown) and an electron blocking layer (EBL) layer disposed in each of the at least two semiconductor light-emitting units, to thereby improve the luminous efficiency of the high-voltage flip-chip semiconductor light-emitting device.

Figure 7:
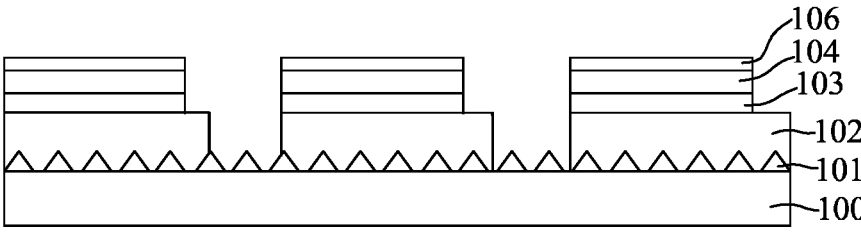

Referring to FIG. 7, the conducting layer 106 is formed and disposed on the second conductivity type semiconductor layer 104 opposite to the light-emitting layer 103. The conducting layer 106 may be light-transmissive, and may be in full contact with the second conductivity type semiconductor layer 104. The conducting layer 106 may be made of one of indium tin oxide (ITO), zinc oxide (ZnO), cadmium tin oxide (CTO), indium oxide (InO), zinc oxide (ZnO) doped with indium (In), zinc oxide (ZnO) doped with aluminum (Al), zinc oxide (ZnO) doped with gallium (Ga), and combinations thereof. In this embodiment, the conducting layer 106 is made of indium tin oxide (ITO). A percentage of an area of an upper surface of the second conductivity type semiconductor layer 104 covered by the conducting layer 106 relative to the area of the upper surface of the second conductivity type semiconductor layer 104 may be not smaller than 80% or 90%. The conducting layer 106 may have a thickness ranging from 10 nm to 200 nm.

The conducting layer 106 may be formed by sputtering, and may be etched to form a patterned conducting layer, depending on needs. In certain embodiments, the conducting layer 106 is formed by sputtering and is then subjected to a high temperature annealing treatment, so as to form an excellent ohmic contact between the conducting layer 106 and the second conductivity type semiconductor layer 104. The high temperature annealing treatment for the conducting layer 106 may be conducted at a temperature that is not lower than 500° C.

Figure 8:
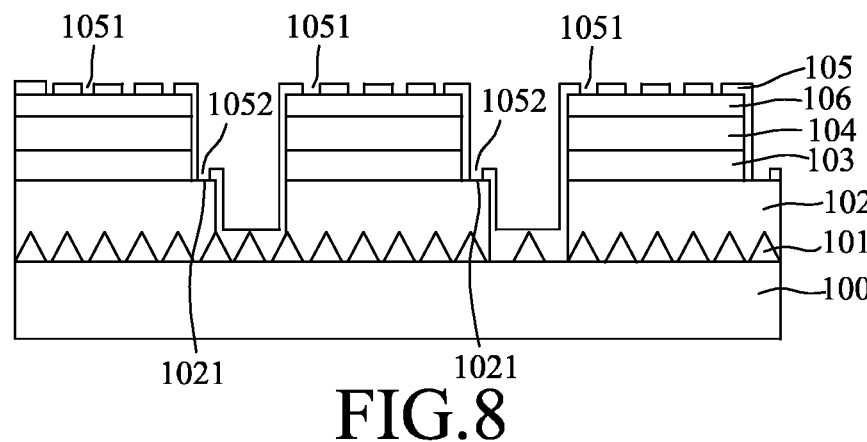
Figure 9:
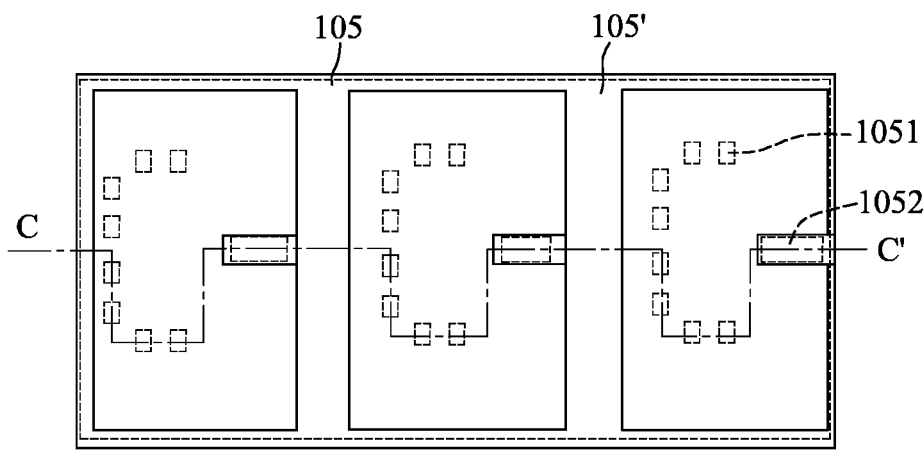

Referring to FIGS. 8 and 9, the isolating layer 105 is formed in the isolation trench 105', and fully covers the side surface of each of the at least two semiconductor light-emitting units and the first surface of the substrate 100 that defines the isolation trench 105'. In addition, the isolating layer 105 covers a side surface of the conducting layer 106 and a portion of an upper surface of the conducting layer 106. The upper surface of the conducting layer 106 is partially exposed from the isolating layer 105. The isolating layer 105 can be used to insulate and isolate the connecting layer 107 and the side surface of each of the at least two semiconductor light-emitting units. The isolating layer 105 may be formed by one of chemical vapor deposition (CVD), physical vapor deposition (PVD), and sputtering. The isolating layer 105 may be made of an insulating material, such as silicon dioxide ($SiO_2$) and silicon nitride ($Si_3N_4$). The isolating layer 105 may be light-transmissive, so that light emitted from the light-emitting layer 103 can transmit through the isolating layer 105. In certain embodiments, the isolating layer 105 may have a transmittance greater than 80%.

The isolating layer 105 may be patterned by etching or striping. In such case, the patterned isolating layer 105 may have at least one area to expose the upper surface of the conducting layer 106. In certain embodiments, the isolating layer 105 is formed with at least one opening 1051 to expose the upper surface of the conducting layer 106 that is distal from the first surface of the substrate 100, so that the connecting layer 107 can be disposed to contact the exposed upper surface of the conducting layer 106 through the at least one opening 1051. A shape of a cross section of the at least one opening 1051 may vary depending on needs. The isolating layer 105 can be further formed with a second opening 1052 to expose the first platform 1021, so that the connecting layer 107 can contact the first platform 1021 through the second opening 1052.

The isolating layer 105 may have a thickness ranging from 100 nm to 1000 nm.

Figure 10:
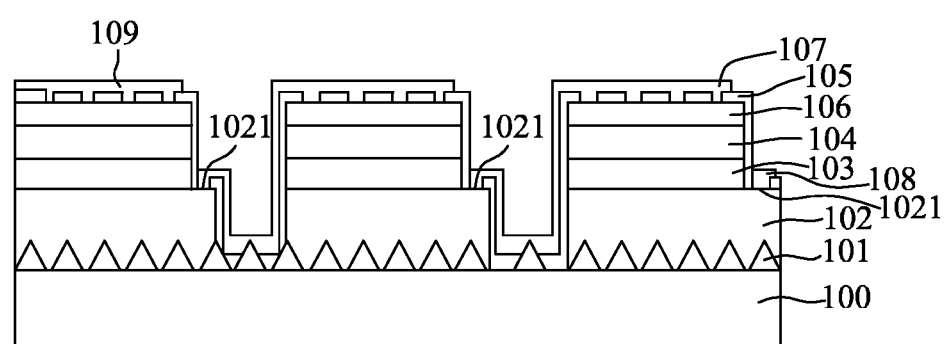

Referring to FIG. 10, the connecting layer 107, the first electrode 108 and the second electrode 109 are formed. The connecting layer 107 is disposed on the isolating layer 105, contacts the exposed upper surface of the conducting layer 106, and electrically connects the at least two semiconductor light-emitting units. The isolating layer 105 is disposed between the connecting layer 107 and the side surface of each of the at least two semiconductor light-emitting units. The connecting layer 107 may electrically connect the at least two semiconductor light-emitting units in series or in parallel. In this embodiment, the connecting layer 107 electrically connects the at least two semiconductor light-emitting units in series. Specifically, the connecting layer 107 has a first end portion and a second end portion opposite to the first end portion. The first end portion of the connecting layer 107 is in direct contact with the first platform 1021 of one of the at least two semiconductor light-emitting units, and the second end portion of the connecting layer 107 covers the isolating layer 105 disposed on the other one of at least two semiconductor light-emitting units and passes through the at least one opening 1051 to be in direct contact with the conducting layer 106 disposed on the other one of the at least two semiconductor light-emitting units. In certain embodiments, the isolating layer 105 is formed with a plurality of the openings 1051, so that the second end portion of the connecting layer 107 can pass through the openings 105 to form an ohmic contact with the conducting layer 106, which may facilitate a lateral spreading of current in the conducting layer 106. The first electrode 108 is formed on the first platform 1021 of one of the at least two semiconductor light-emitting units, and is in direct contact and electrically connected to the first conductivity type semiconductor layer 102 of the one of the at least two semiconductor light-emitting units. The second electrode 109 is formed on the other one of the at least two semiconductor light-emitting units, and passes through the openings 1051 to form an ohmic contact with the conducting layer 106.

Each of the connecting layer 107, the first electrode 108 and the second electrode 109 may be made of a metal that has a reflection function and/or an ohmic contact function. In certain embodiments, each of the connecting layer 107, the first electrode 108 and the second electrode 109 may have a strip-like shape or a bulky shape. The connecting layer 107, the first electrode 108 and the second electrode 109 may be formed by evaporation.

Figure 11:
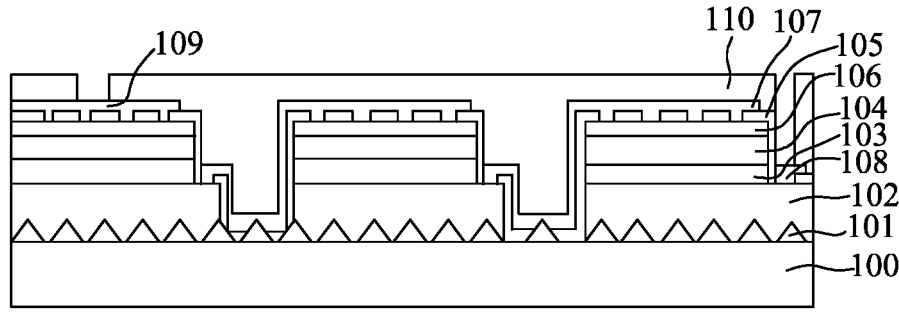
Figure 12:
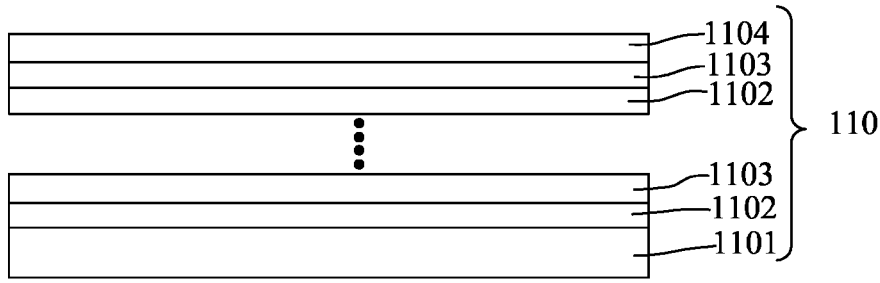

Referring to FIG. 11, the Bragg reflection layer 110 is formed to cover the connecting layer 107 and the isolating layer 105. The Bragg reflection layer 110 has a first opening and a second opening that are registered with the first electrode 108 and the second electrode 109, respectively. The Bragg reflection layer 110 may be formed by deposition and etching. Referring to FIG. 12, the Bragg reflection layer 110 may include multiple pairs of reflection sublayers, and the reflection sublayers in each pair contain a first insulating layer 1102 and a second insulating layer 1103. The first insulating layers 1102 and the second insulating layers 1103 are alternately stacked in the Bragg reflection layer 110. The second insulating layer 1103 has a refractive index lower than a refractive index of the first insulating layer 1102. In certain embodiments, the first insulating layer 1102 is a silicon oxide ($SiO_2$) layer, and the second insulating layer 1103 is a titanium oxide ($TiO_2$) layer. The Bragg reflection layer 110 may have an optical thickness that is equal to or close to a quarter of an emission wavelength of light emitted from the light-emitting layer 103. In certain embodiments, the optical thickness of the Bragg reflection layer 110 is not smaller than 2 μm, such as ranging from 4 μm to 5 μm. In such case, a number of the pairs of the Bragg reflection layer 110 may range from 4 to 20. The Bragg reflection layer 110 may be formed by ion-beam assisted deposition. In this embodiment, the Bragg reflection layer 110 may further include a topmost layer 1104 that is proximate to external environment and that is made of silicon nitride (SiNx). The topmost layer 1104 can prevent the high-voltage flip-chip semiconductor light-emitting device from being affected by moisture due to its excellent moisture-proof property. In certain embodiments, the thickness of the isolating layer 105 may be greater than that of each of the reflection sublayers of the Bragg reflection layer 110.

The Bragg reflection layer 110 can efficiently reflect light emitted from the light-emitting layer 103, thereby increasing an amount of light emitted from the light-emitting layer 103 and passing through the second surface of the substrate 100, enhancing the brightness of the high-voltage flip-chip semiconductor light-emitting device and improving the luminous efficiency of the high-voltage flip-chip semiconductor light-emitting device.

In this embodiment, the Bragg reflection layer 110 may further include a bottommost layer 1101 that can act as an interfacial layer to enhance distribution of the Bragg reflection layer 110 on the isolating layer 105 or the conducting layer 106. The bottommost layer 1101 may be formed by plasma-enhanced CVD (PECVD) to increase a density thereof. The bottommost layer 1101 may have a thickness ranging from 0.2 μm to 1.0 μm. The bottommost layer 1101 may be made of silicon oxide ($SiO_2$). In certain embodiments, the Bragg reflection layer 110 may include the bottommost layer 1101 made of silicon oxide ($SiO_2$), and the first insulating layer 1102 made of silicon oxide ($SiO_2$) and the second insulating layer 1103 made of titanium oxide ($TiO_2$) that are alternately stacked on the bottommost layer 1101. The bottommost layer 1101 may fully cover the conducting layer 106 and the connecting layer 107, so as to prevent the side surface of each of the at least two semiconductor light-emitting units and the conducting layer 106 from being damaged by ion-beam assisted deposition.

The Bragg reflection layer 110 may have a relatively high reflectance for a visible light. The Bragg reflection layer 110 indirectly covers the at least two semiconductor light-emitting units and the isolation trench 105', which can effectively reflect light emitted from the light-emitting layer 103 of each of the at least two semiconductor light-emitting units. In certain embodiments, the reflectance of the Bragg reflection layer 110 is not smaller than 90% with respect to light having an incident angle ranging from 0° to 60° and having an emission wavelength ranging from 400 nm to 700 nm.

Figure 13:
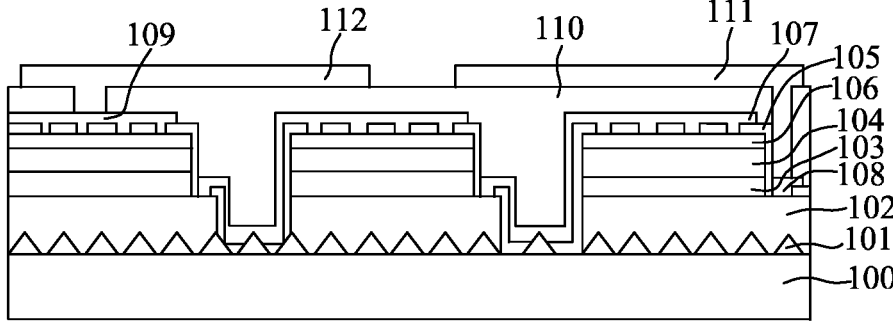

Referring to FIG. 13, the first electrode pad 111 and the second electrode pad 112 are disposed on the Bragg reflection layer 110. The first electrode pad 111 passes through the first opening to be electrically connected to the first electrode 108, and the second electrode pad 112 passes through the second opening to be electrically connected to the second electrode 109. The first electrode pad 111 and the second electrode pad 112 are separated by a gap having a predetermined width, so that the first electrode pad 111 and the second electrode pad 112 can be insulated and isolated from each other.

The first electrode pad 111 and the second electrode pad 112 may be connected to other substrates (e.g., a packaging substrate) through a solder paste or a conductive silver by virtue of a reflow process or a high temperature treatment.

The disclosure will be further described by way of the following examples. However, it should be understood that the following examples are solely intended for the purpose of illustration and should not be construed as limiting the disclosure in practice.

Example and Comparative Example

Figure 2:
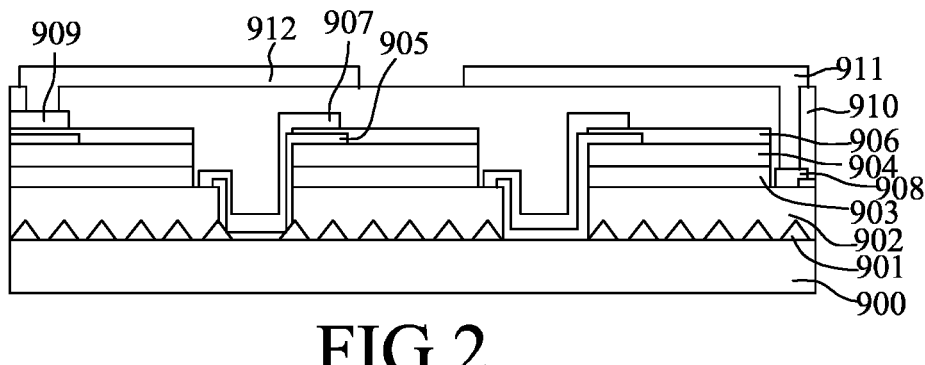
FIG. 2 is a cross-sectional view taken along line A-A' of FIG. 1.
Figure 14A:
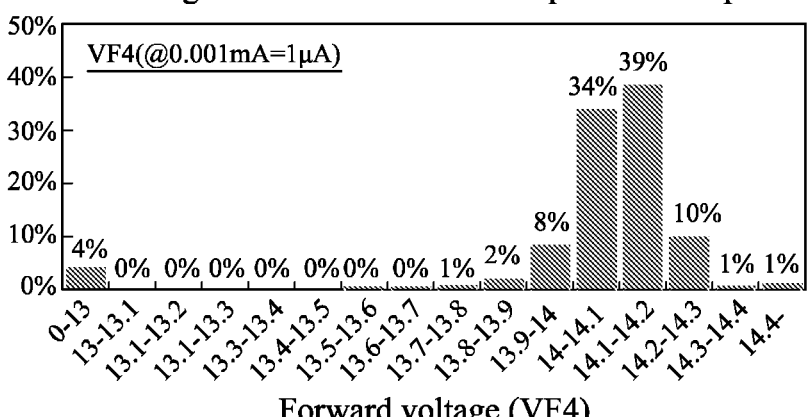
FIGS. 14a and 14b are bar charts showing percentage of a number of tested samples of Example versus forward voltage (VF4) thereof, and percentage of a number of tested samples of Comparative Example versus forward voltage (VF4) thereof, respectively.
Figure 14B:
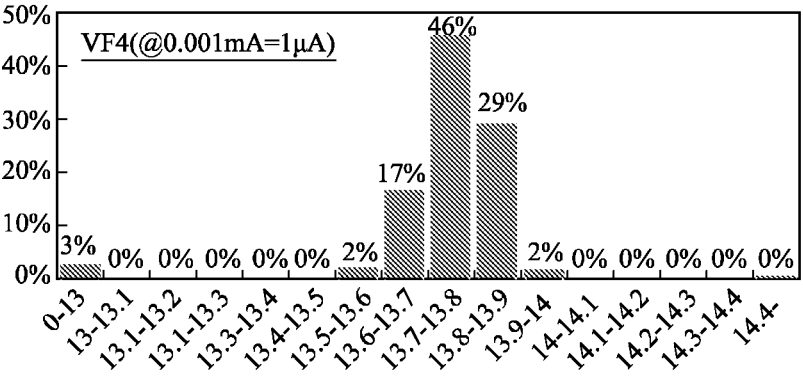
Figures 15A, 15B:
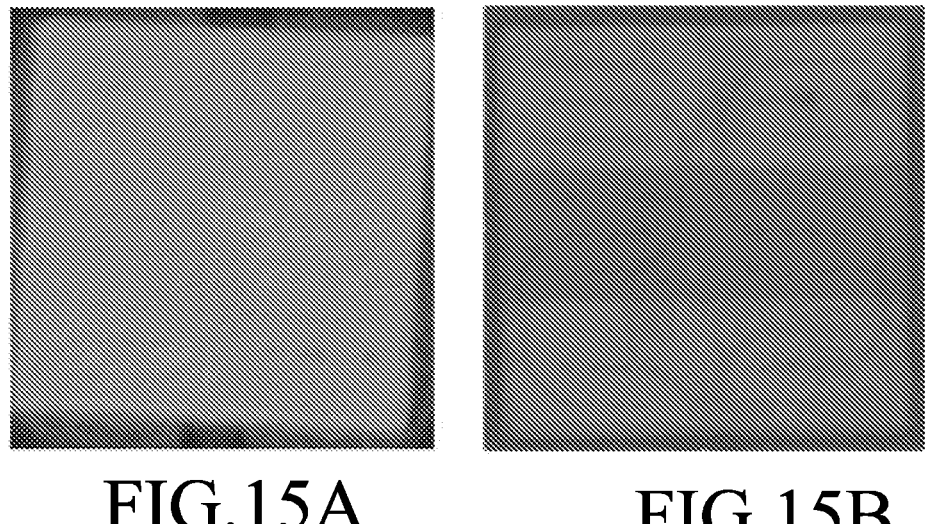
FIGS. 15a and 15b are microscopic images respectively showing the sample of Example and the sample of Comparative Example which are subjected to a lighting test under a current of 1 μA.

To determine a forward voltage (VF4) of the high-voltage flip-chip semiconductor light-emitting device according to this disclosure, a four-inch wafer including 300 of the high-voltage flip-chip semiconductor light-emitting devices (i.e., serving as samples of Example) shown in FIG. 3 of this disclosure was prepared. Each of the high-voltage flip-chip semiconductor light-emitting devices includes six of the semiconductor light-emitting units shown in FIG. 4 that are electrically connected to each other in series. For comparison purpose, another wafer including 300 high-voltage flip-chip light-emitting diodes (i.e., serving as samples of Comparative Example) shown in FIG. 1 was also prepared. Each of the high-voltage flip-chip light-emitting diodes has a structure shown in FIG. 2, and also includes six of the semiconductor light-emitting units that have a structure shown in FIG. 2 and that are electrically connected to each other in series. FIGS. 14*a* and 14*b* illustrate the VF4 of the samples of Example and the Comparative Example, respectively. FIGS. 15*a* and 15*b* respectively show microscopic images of one of the samples of Example and one of the samples of Comparative Example when both samples were subjected to a lighting test under a current of 1 μA.

Forward Voltage (VF4) and Brightness Uniformity Tests

The samples of Example and Comparative Example were subjected to VF4 and brightness uniformity tests. The results are shown in Table 1. As shown in Table 1, the VF4 of the samples of Example was higher than that of the samples of Comparative Example. Furthermore, a ratio (R2) of a number of the samples of Example that met the requirements of brightness uniformity to a total number of the tested samples of Example was higher than a ratio (R2) of a number of the samples of Comparative Example that met the requirements of brightness uniformity to a total number of the tested samples of Comparative Example. These results also indicate that all tested samples of Example exhibit uniform brightness. In contrast, the VF4 of the samples of Comparative Example was relatively low, and the brightness thereof was not uniform. By adjusting the relative position of the conducting layer 106 and the isolating layer 105, the brightness uniformity and the VF4 of the high-voltage flip-chip semiconductor light-emitting device of the disclosure can be improved.

9

TABLE 1

| | Forward voltage (VF4) test | | Brightness uniformity test | | | |
|---|---|---|---|---|---|---|
| | VF4 range | R1 | P | T | R2 | R3 |
| Samples of Comparative Example | 13.6~13.7 | 17% | 10 | 300 | 3.33% | 96.67% |
| | 13.7~13.8 | 46% | 50 | 300 | 16.67% | 83.33% |
| | 13.8~13.9 | 29% | 240 | 300 | 80.00% | 20% |
| Samples of Example | 14~14.1 | 34% | 300 | 300 | 100% | 0% |
| | 14.1~14.2 | 39% | 300 | 300 | 100% | 0% |
| | 14.2~14.3 | 10% | 300 | 300 | 100% | 0% |

R1: a ratio of a number of test samples at a corresponding one of VF4 ranges to a total number of the test samples;
P: a number of the test samples that met the requirements of brightness uniformity;
T: the total number of the test samples;
R2: (P/T) × 100%;
R3: 100% − R2.

The high-voltage flip-chip semiconductor light-emitting device of the disclosure can be applied in a display device. In certain embodiments, the display device has a local dimming function. Alternatively, the high-voltage flip-chip semiconductor light-emitting device of the disclosure can be applied in an RGB display device, so that the RGB display device can have the brightness uniformity and higher VF4 under the small current.

Figure 16:
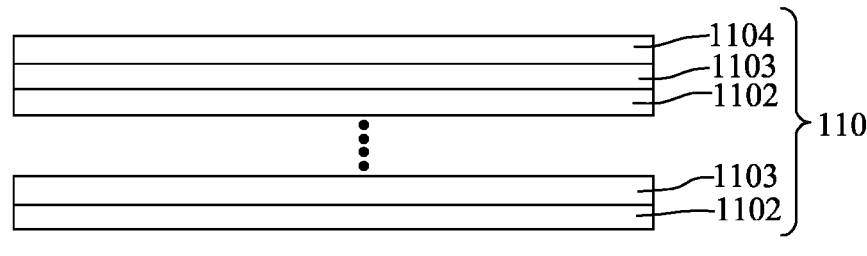
FIG. 16 is a variation of the first embodiment.

In a variation of the first embodiment, as shown in FIG. 16, the Bragg reflection layer 110 does not include the bottommost layer 1101. In this embodiment, the isolating layer 105 can function as the bottommost layer 1101, completely covers the side surface of each of the at least two semiconductor light-emitting units, and is disposed on the conducting layer 106 to protect the side surface of each of the at least two semiconductor light-emitting units and the conducting layer 106.

In certain embodiments, the isolating layer 105 may be formed by PECVD to increase a density thereof. In such case, the density of the isolating layer 105 may be greater than a density of each of the first insulating layer 1102 and the second insulating layer 1103. Since the isolating layer 105 is not easily damaged by ion-beam assisted deposition, the Bragg reflection layer 110 can be directly formed on the isolating layer 105.

By sequentially forming the conducting layer 106 and the isolating layer 105 that can insulate and isolate each of the at least two semiconductor light-emitting units and the connecting layer 107, the high-voltage flip-chip semiconductor light-emitting device has the following advantages.

Firstly, compared with the conventional high-voltage flip-chip light-emitting diode, the brightness uniformity and the VF4 of the high-voltage flip-chip semiconductor light-emitting device can be increased.

Secondly, the connecting layer 107 passing through the at least one opening 1051 can form an ohmic contact with the conducting layer 106, which is conducive for the lateral spreading of current in the conducting layer 106.

Finally, since the isolating layer 105 can function as the bottommost layer 1101 and protect the at least two semiconductor light-emitting units and the conducting layer 106 from being damaged by ion-beam assisted deposition, the process for forming the Bragg reflection layer 110 is simple, and a production cost for manufacturing the high-voltage flip-chip semiconductor light-emitting device can be reduced.

Figure 17:
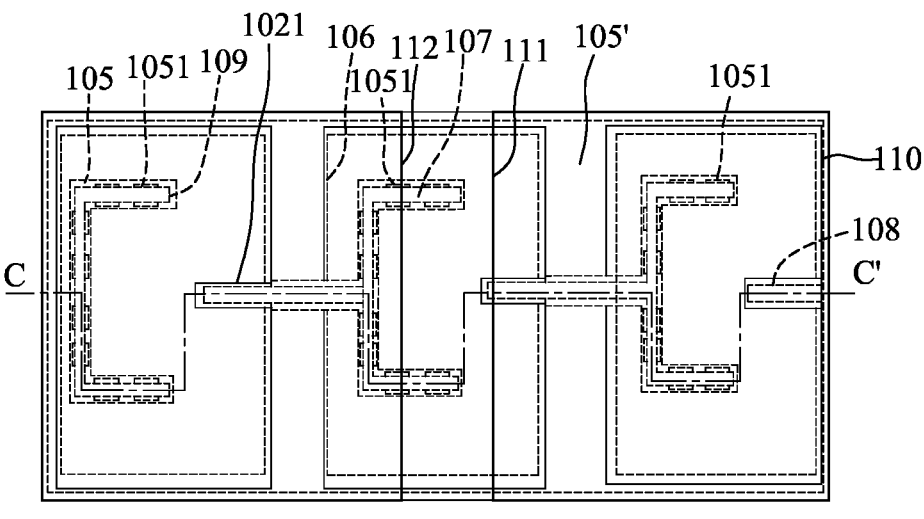
FIG. 17 is a schematic top view illustrating a second embodiment of the high-voltage flip-chip semiconductor light-emitting device according to the disclosure.
Figure 18:
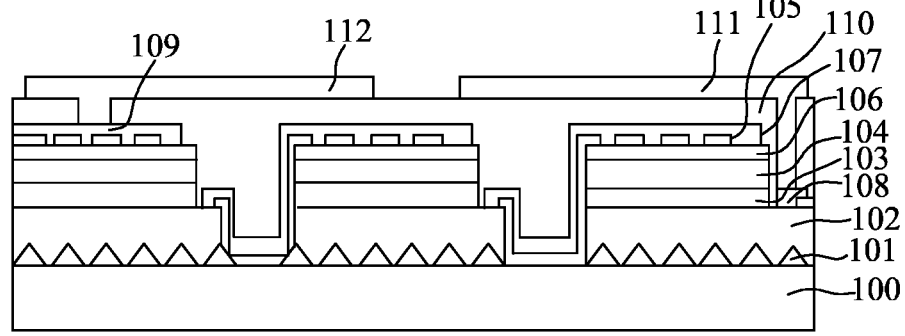
FIG. 18 is a cross-sectional view taken along line C-C' of FIG. 17.
Figure 19:
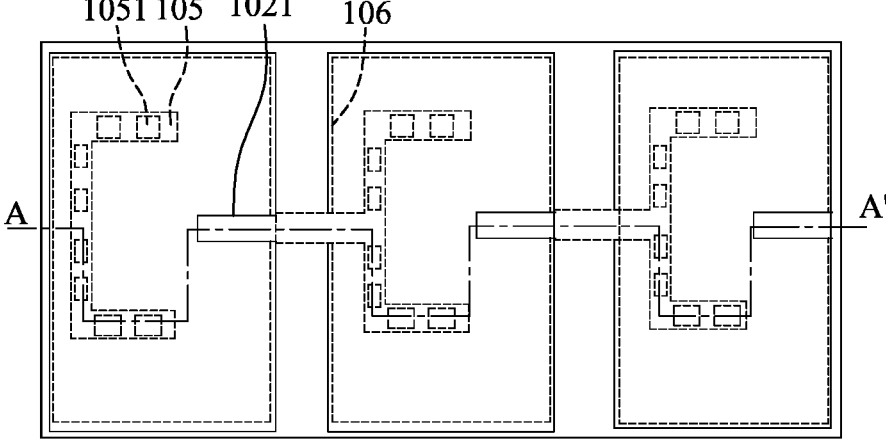
FIG. 19 is a schematic top view illustrating an isolating layer disposed on a conducting layer in the second embodiment.
Figure 20:
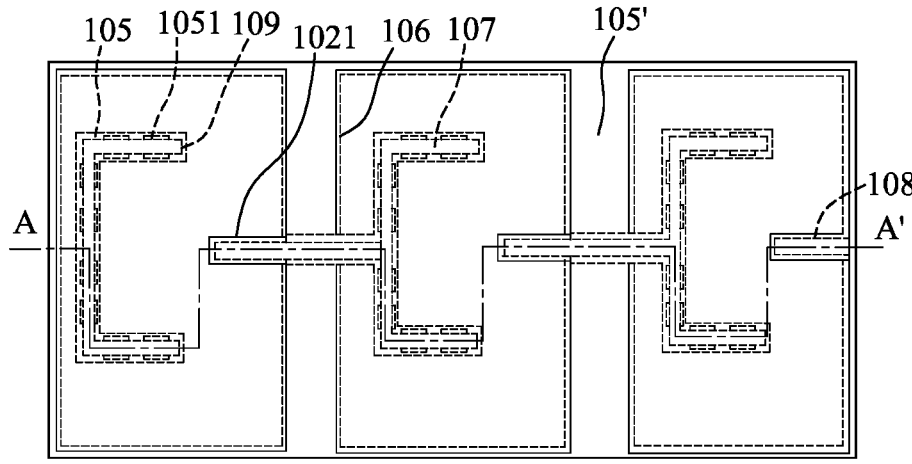
FIG. 20 is a schematic top view illustrating a connecting layer, a first electrode and a second electrode disposed on the isolating layer in the second embodiment.

Referring to FIGS. 17 and 18, a second embodiment of the high-voltage flip-chip semiconductor light-emitting device according to the present disclosure is generally similar to the first embodiment, except that, in the second embodiment, the isolating layer 105 partially covers the side surface of the conducting layer 106, and the side surface of the conducting layer 106 not covered by the isolating layer 105 is also not covered by the connecting layer 107. FIG. 19 illustrates a top view of the isolating layer 105 disposed on the conducting layer 106. FIG. 20 illustrates a top view of the connecting layer 107, the first electrode 108, and the second electrode 109 disposed on the isolating layer 105. A projection of the isolating layer 105 on the conducting layer 106 has a shape similar to and is in positional correspondence with a projection of the connecting layer 107 on the conducting layer 106, so that a current flowing in a direction from the connecting layer 107 to the conducting layer 106 can be partially blocked by the isolating layer 105. In this embodiment, the isolating layer 105 may have a bulky shape and has a plurality of the openings 1051, so that the connecting layer 107 can pass through the openings 1051 to form the ohmic contact with the conducting layer 106. Alternatively, the isolating layer 105 may be formed with a plurality of isolating units that are spacedly disposed on the conducting layer 106, so that the connecting layer 107 can pass through gaps between the isolating units to form the ohmic contact with the conducting layer 106.

Figure 21:
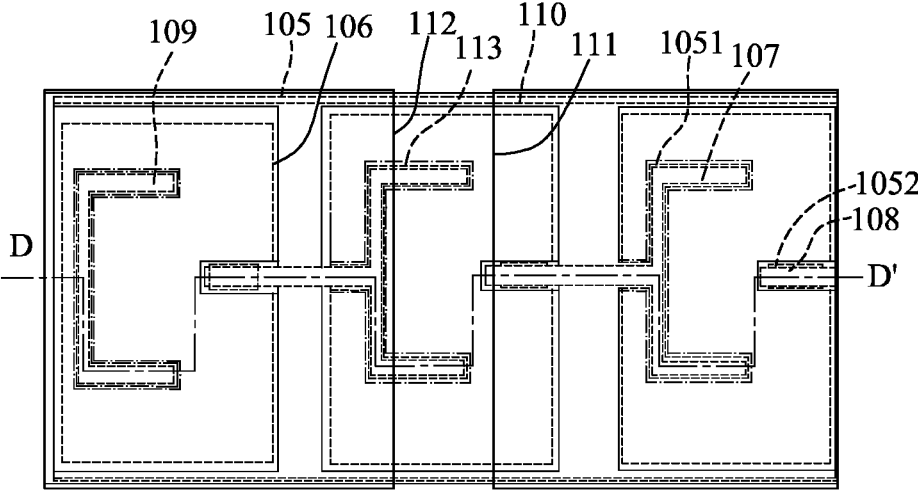
FIG. 21 is a schematic top view illustrating a third embodiment of the high-voltage flip-chip semiconductor light-emitting device according to the disclosure.
Figure 22:
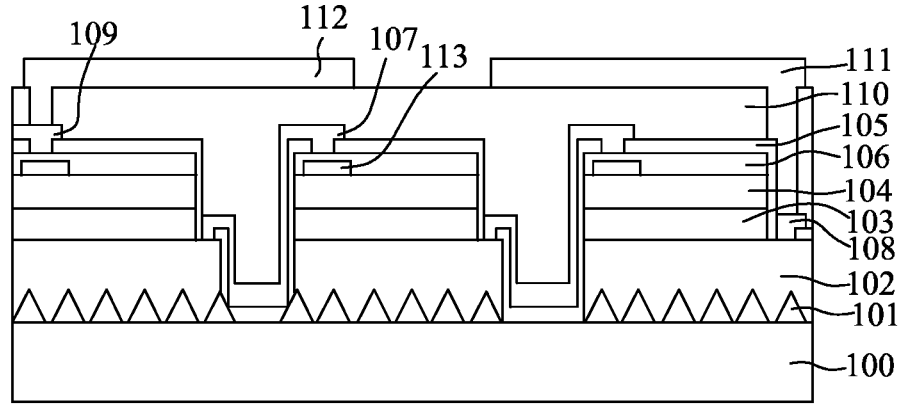
FIG. 22 is a cross-sectional view taken along line D-D' of FIG. 21.

Referring to FIGS. 21 and 22, a third embodiment of the high-voltage flip-chip semiconductor light-emitting device according to the present disclosure is generally similar to the first embodiment, except that, in the third embodiment, the high-voltage flip-chip semiconductor light-emitting device further includes a current blocking layer 113 disposed between the conducting layer 106 and the second conductivity type semiconductor layer 104 to avoid a current flow in a direction from the connecting layer 107 to the second conductivity type semiconductor layer 104 and facilitating the lateral spreading of the current in the conducting layer 106. In certain embodiments, a projection of the current blocking layer 113 on the second conductivity type semiconductor layer 104 has a shape similar to and is in positional correspondence with a projection of each of the connecting layer 107 and the second electrode 109 on the second conductivity type semiconductor layer 104.

The current blocking layer 113 may be formed on the second conductivity type semiconductor layer 104 by photolithography and chemical deposition. The current blocking layer 113 may have a thickness ranging from 10 nm to 500 nm. The current blocking layer 113 may be made of a light-transmissive dielectric layer, such as silicon oxide or silicon nitride.

Figure 23:
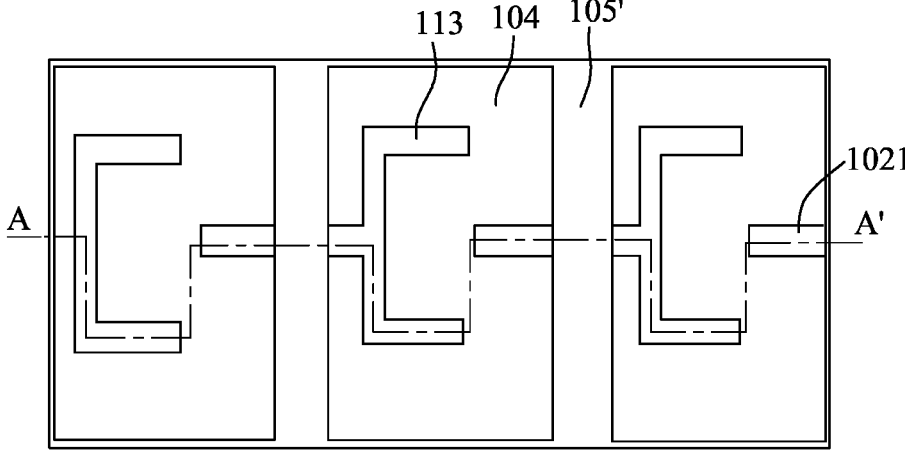
FIG. 23 is a schematic top view illustrating a current blocking layer disposed on a corresponding one of at least two semiconductor light-emitting units in the third embodiment.
Figure 24:
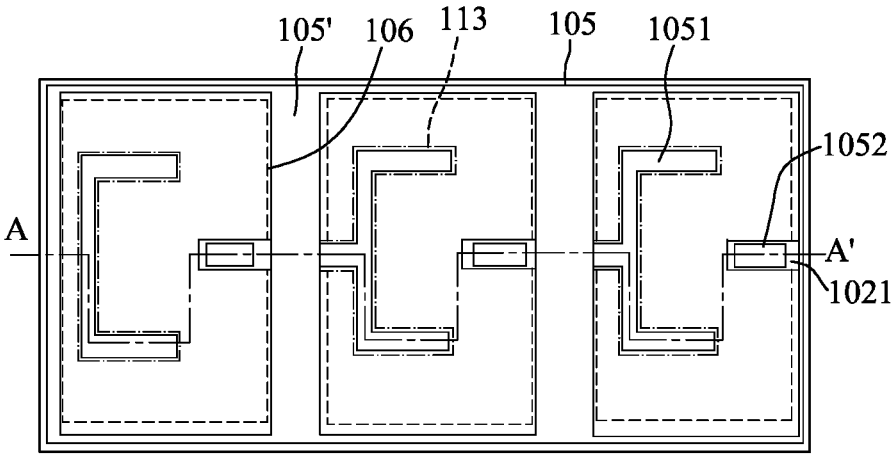
FIG. 24 is a schematic top view illustrating the conducting layer and the isolating layer sequentially formed on the current blocking layer in the third embodiment.

FIG. 23 illustrates the current blocking layer 113 disposed on a corresponding one of the at least two semiconductor light-emitting units. In certain embodiments, the current blocking layer 113 may have a bulky shape, and a projection of an area of the current blocking layer 113 on the second conductivity type semiconductor layer 104 may be greater than a projection of an area of the connecting layer 107 on the second conductivity type semiconductor layer 104, so that the current blocking layer 113 can efficiently block a current flow in a direction from the connecting layer 107 to the second conductivity type semiconductor layer 104, facilitate lateral spreading of the current in the conducting layer 106 and enhance the brightness of the high-voltage flip-chip semiconductor light-emitting device. FIG. 24 illustrates the conducting layer 106 and the isolating layer 105 sequentially formed on the current blocking layer 113. In this case, the isolating layer 105 covers the side surface of each of the at least two semiconductor light-emitting units, the first surface of the substrate 100, and the conducting layer 106. In addition, the isolating layer 105 has the at least one opening 1051 that is registered with the current blocking layer 113 and the second opening 1052 on the first platform 1021. In certain embodiments, the current blocking layer 113 may include a plurality of blocking units (not shown) that are spaced apart from one another.

Figure 25:
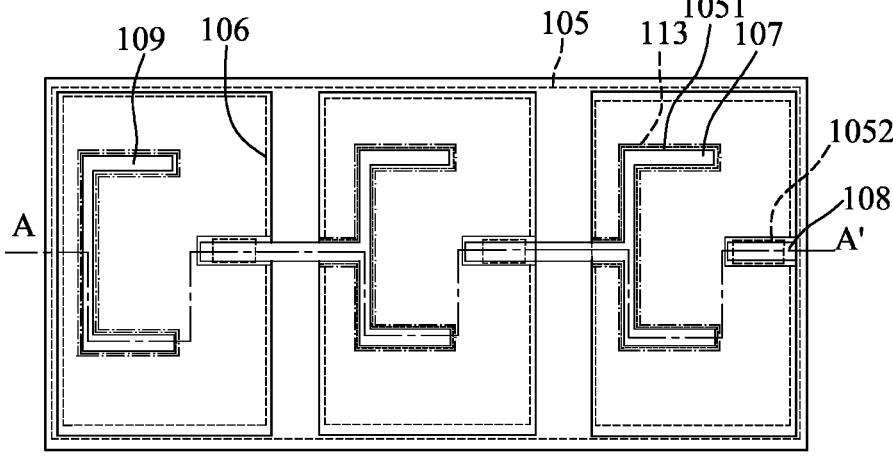
FIG. 25 is a schematic top view illustrating the connecting layer, the first electrode and the second electrode formed on the structure of FIG. 24.

FIG. 25 illustrates the connecting layer 107, the first electrode 108 and the second electrode 109 formed on the structure of FIG. 24.

It is noted that if the current blocking layer 113 is formed to cover the side surface of the conducting layer 106, the brightness of the high-voltage flip-chip semiconductor light-emitting device may be not uniform.

The high-voltage flip-chip semiconductor light-emitting device of this disclosure can be applied in a display device that includes a backlight module having a high contrast between light-emitting regions of the backlight module. Such backlight module includes a substrate, the high-voltage flip-chip semiconductor light-emitting devices disposed on the substrate, and a fluorescent material layer.

With development of display technologies, a demand for a display device with improved display effect is increasing. When the contrast between the light-emitting regions of the backlight module is high, the display device can have a good display effect. The display device may further include a driving circuit and/or a control circuit that is integrated in the backlight module. The control circuit may include, but not limited to, an adjusting circuit for local dimming. In such case, a duty cycle of the display device can be adjusted by controlling a pulse width modulation (PWM) of an integrated circuit of the display device to further adjust a brightness of each of display areas of the display device in registered with a corresponding one of the light-emitting regions. By independently adjusting the brightness of each of the display areas of the display device in registration with the corresponding one of the light-emitting regions, a contrast of an image generated from the display device can be increased. Each of the high-voltage flip-chip semiconductor light-emitting devices of the backlight module may emit a blue light towards a corresponding one of the light-emitting regions. The blue light emitted from each of the high-voltage flip-chip semiconductor light-emitting devices may have an emission wavelength ranging from 440 nm to 450 nm.

The substrate of the backlight module may be a printed circuit board (PCB) that has a driving circuit that can drive the high-voltage flip-chip semiconductor light-emitting devices respectively located in different regions of the substrate. The first electrode pad 111 and the second electrode pad 112 of each of the high-voltage flip-chip semiconductor light-emitting devices can attach to the substrate by die bonding.

The fluorescent material layer may include a red phosphor material and a green phosphor material, which can be excited by blue light to emit red light and green light in all directions. Therefore, light emitted from each of the high-voltage flip-chip semiconductor light-emitting devices and transmitted through the fluorescent material layer can include one of red light, green light, blue right, or combinations thereof.

This disclosure also provides a backlight display device that includes the backlight module as mentioned above and a liquid crystal display panel. In such backlight display device, the backlight module can provide a backlight for the liquid crystal display panel.

The backlight display device may be any product or device having a display function, such as a liquid crystal display device, an electronic paper, a cell phone, a tablet computer, a TV, a display, a notebook, a digital photo frame, or a navigator.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A high-voltage flip-chip semiconductor light-emitting device, comprising:

a substrate having a first surface and a second surface which are spaced apart from each other;

at least two semiconductor light-emitting units, each of which includes a first conductivity type semiconductor layer, a light-emitting layer, and a second conductivity type semiconductor layer which are sequentially disposed on said first surface of said substrate;

an isolation trench formed between and separating said at least two semiconductor light-emitting units, and defined by said first surface of said substrate and a side surface of each of said at least two semiconductor light-emitting units;

a conducting layer disposed on said second conductivity type semiconductor layer opposite to said light-emitting layer;

an isolating layer covering said side surface of each of said at least two semiconductor light-emitting units, a side surface of said conducting layer, and a portion of an upper surface of said conducting layer, said upper surface of said conducting layer being partially exposed from said isolating layer;

a connecting layer disposed on said isolating layer, contacting said exposed upper surface of said conducting layer, and electrically connecting said at least two semiconductor light-emitting units; and a Bragg reflection layer covering said connecting layer and said isolating layer, wherein said isolating layer is formed with a plurality of openings to expose said upper surface of said conducting layer, so that said connecting layer can be disposed to contact said exposed upper surface of said conducting layer through said plurality of openings; and wherein said high-voltage flip-chip semiconductor light-emitting device further includes a first electrode and a second electrode, said first electrode being in direct contact with said first conductivity type semiconductor layer of one of said at least two semiconductor light-emitting units, said second electrode being in contact with said conducting layer of another one of said at least two semiconductor light-emitting units, said connecting layer being in direct contact with said first conductivity type semiconductor layer of one of said at least two semiconductor light-emitting units and said conducting layer of another one of said at least two semiconductor light-emitting units.

2. The high-voltage flip-chip semiconductor light-emitting device of claim 1, wherein said conducting layer is in full contact with said second conductivity type semiconductor layer.

3. The high-voltage flip-chip semiconductor light-emitting device of claim 2, wherein said isolating layer covers said side surface of each of said at least two semiconductor light-emitting units.

4. The high-voltage flip-chip semiconductor light-emitting device of claim 1, further comprising a current blocking layer disposed between said conducting layer and said second conductivity type semiconductor layer to avoid a current flow in a direction from said connecting layer to said second conductivity type semiconductor layer.

5. The high-voltage flip-chip semiconductor light-emitting device of claim 1, wherein said isolating layer is disposed between said connecting layer and said side surface of each of said at least two semiconductor light-emitting units.

6. The high-voltage flip-chip semiconductor light-emitting device of claim 1, wherein said isolating layer is formed in said isolation trench, and covers said side surface of each of said at least two semiconductor light-emitting units and said first surface of said substrate that defines said isolation trench.

7. The high-voltage flip-chip semiconductor light-emitting device of claim 1, wherein said Bragg reflection layer includes a plurality of reflection sublayers, a density of said isolating layer being greater than a density of said Bragg reflection layer.

8. The high-voltage flip-chip semiconductor light-emitting device of claim 1, wherein said Bragg reflection layer includes a plurality of reflection sublayers, said isolating layer having a thickness greater than that of each of said reflection sublayers.

9. The high-voltage flip-chip semiconductor light-emitting device of claim 1, wherein said isolating layer has a thickness ranging from 100 nm to 1000 nm.

10. The high-voltage flip-chip semiconductor light-emitting device of claim 1, wherein said conducting layer has a thickness ranging from 10 nm to 200 nm.

11. The high-voltage flip-chip semiconductor light-emitting device of claim 1, further comprising a first electrode pad and a second electrode pad, said Bragg reflection layer having a first opening and a second opening, said first electrode pad passing through said first opening to be electrically connected to said first electrode, said second electrode pad passing through said second opening to be electrically connected to said second electrode.

12. The high-voltage flip-chip semiconductor light-emitting device of claim 1, wherein said connecting layer electrically connects said at least two semiconductor light-emitting units in series.

13. A display device, comprising a backlight module that includes the high-voltage flip-chip semiconductor light-emitting device as claimed in claim 1.

14. The display device of claim 13, further comprising a driving circuit for local dimming.

15. An RGB display device, comprising the high-voltage flip-chip semiconductor light-emitting device as claimed in claim 1.

16. A high-voltage flip-chip semiconductor light-emitting device, comprising:

a substrate having a first surface and a second surface which are spaced apart from each other;

at least two semiconductor light-emitting units, each of which includes a first conductivity type semiconductor layer, a light-emitting layer, and a second conductivity type semiconductor layer which are sequentially disposed on said first surface of said substrate;

an isolation trench formed between and separating said at least two semiconductor light-emitting units, and defined by said first surface of said substrate and a side surface of each of said at least two semiconductor light-emitting units;

a conducting layer disposed on said second conductivity type semiconductor layer opposite to said light-emitting layer;

an isolating layer covering said side surface of each of said at least two semiconductor light-emitting units, a side surface of said conducting layer, and a portion of an upper surface of said conducting layer, said upper surface of said conducting layer being partially exposed from said isolating layer;

a connecting layer disposed on said isolating layer, contacting said exposed upper surface of said conducting layer, and electrically connecting said at least two semiconductor light-emitting units; and a Bragg reflection layer covering said connecting layer and said isolating layer, wherein said isolating layer is formed with a plurality of openings to expose said upper surface of said conducting layer, so that said connecting layer can be disposed to contact said exposed upper surface of said conducting layer through said plurality of openings; and wherein said Bragg reflection layer includes a plurality of reflection sublayers, a density of said isolating layer being greater than a density of said Bragg reflection layer.

17. The high-voltage flip-chip semiconductor light-emitting device of claim 16, wherein said conducting layer is in full contact with said second conductivity type semiconductor layer.

18. The high-voltage flip-chip semiconductor light-emitting device of claim 17, wherein said isolating layer covers said side surface of each of said at least two semiconductor light-emitting units.

19. The high-voltage flip-chip semiconductor light-emitting device of claim 16, further comprising a current blocking layer disposed between said conducting layer and said second conductivity type semiconductor layer to avoid a current flow in a direction from said connecting layer to said second conductivity type semiconductor layer.

20. The high-voltage flip-chip semiconductor light-emitting device of claim 16, wherein said isolating layer is formed in said isolation trench, and covers said side surface of each of said at least two semiconductor light-emitting units and said first surface of said substrate that defines said isolation trench.

* * * * *